(12) United States Patent
Ohta et al.

(10) Patent No.: US 7,780,503 B2
(45) Date of Patent: Aug. 24, 2010

(54) POLISHING APPARATUS AND POLISHING METHOD

(75) Inventors: Shinrou Ohta, Tokyo (JP); Noburu Shimizu, Tokyo (JP); Yoichi Kobayashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 12/292,453

(22) Filed: Nov. 19, 2008

(65) Prior Publication Data

US 2009/0130956 A1 May 21, 2009

(30) Foreign Application Priority Data

Nov. 20, 2007 (JP) .............................. 2007-300511

(51) Int. Cl.
 *B24B 49/00* (2006.01)
(52) U.S. Cl. ............................... 451/6; 451/10; 451/11; 451/41; 451/287; 257/E21.528; 156/345.13
(58) Field of Classification Search .................... 451/5, 451/6, 9, 10, 11, 41, 59, 285, 287; 257/E21.528; 356/320, 630; 156/345.13, 345.16
See application file for complete search history.

(56) References Cited

U.S. PATENT DOCUMENTS

| 5,609,511 | A | * | 3/1997 | Moriyama et al. | ............. | 451/5 |
| 6,093,081 | A | * | 7/2000 | Nyui et al. | ..................... | 451/6 |
| 6,108,091 | A | * | 8/2000 | Pecen et al. | .................. | 356/630 |
| 6,621,584 | B2 | * | 9/2003 | Pecen et al. | .................. | 356/630 |
| 6,663,469 | B2 | | 12/2003 | Kimura et al. | | |
| 7,086,929 | B2 | | 8/2006 | Wiswesser et al. | | |
| 7,481,945 | B2 | * | 1/2009 | Matsukawa | .................. | 216/85 |
| 2002/0002029 | A1 | * | 1/2002 | Kimura et al. | ................. | 451/41 |
| 2002/0089676 | A1 | * | 7/2002 | Pecen et al. | .................. | 356/630 |
| 2004/0224613 | A1 | * | 11/2004 | Kimura et al. | ................. | 451/8 |
| 2004/0235392 | A1 | * | 11/2004 | Ohta | ............................. | 451/6 |
| 2005/0254051 | A1 | * | 11/2005 | Shima et al. | ................ | 356/369 |

FOREIGN PATENT DOCUMENTS

WO 2004/035265 4/2004

* cited by examiner

*Primary Examiner*—Eileen P. Morgan
(74) *Attorney, Agent, or Firm*—Wenderoth, Lind & Ponack, L.L.P.

(57) ABSTRACT

A polishing apparatus makes it possible to polish and remove an extra conductive film while preventing the occurrence of erosion and without lowering of the throughput. The polishing apparatus includes: a polishing table having a polishing surface; a top ring for holding a workpiece having a surface conductive film, and pressing the conductive film against the polishing surface to polish the conductive film; an optical sensor for monitoring the polishing state of the conductive film by emitting light toward the conductive film of the workpiece held by the top ring, receiving reflected light from the conductive film, and measuring a change in the reflectance of the reflected light; and a control section for controlling a pressure at which the workpiece is pressed on the polishing surface.

11 Claims, 7 Drawing Sheets

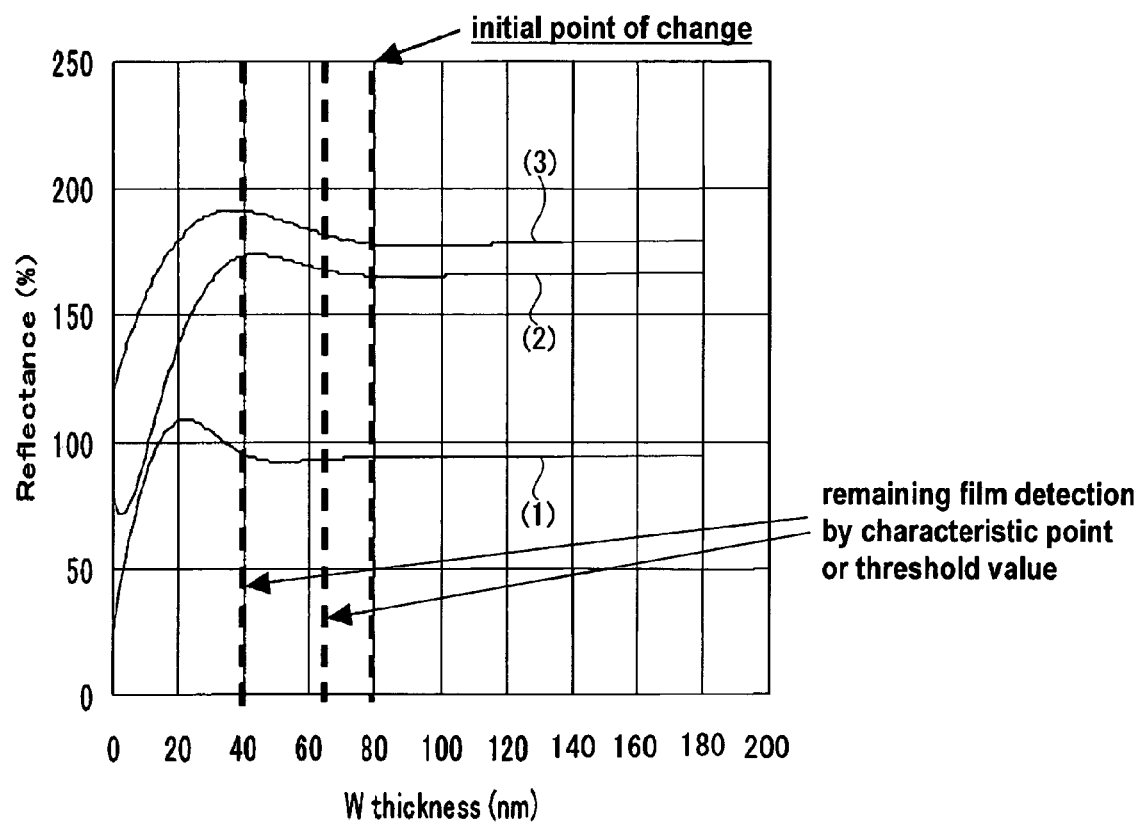

POLISHING APPARATUS AND POLISHING METHOD

BACKGROUND OF THE INVENTION

1. Field of the Invention

The present invention relates to a polishing apparatus and a polishing method, and more particularly to a polishing apparatus and a polishing method for polishing a surface conductive film (metal film) of a substrate, such as a semiconductor wafer, and flattening the surface of the substrate.

2. Description of the Related Art

For the formation of interconnects in a semiconductor device, a so-called damascene process is employed which comprises forming a barrier metal film on interior surfaces of trenches and contact holes formed in an insulating film, filling a metal such as copper, as an interconnect and contact material, into the trenches and contact holes, and then removing an extra metal by chemical mechanical polishing (CMP). A damascene process, when it forms interconnects and contacts simultaneously, is called dual damascene process.

FIG. 1A to 1C illustrate an exemplary dual damascene process for forming copper interconnects. First, as shown in FIG. 1A, an insulating film 2 of, e.g., an $SiO_2$ oxide film or a low-k material is deposited on a conductive layer 1$a$, in which semiconductor elements are formed, on a semiconductor base 1 of a substrate W; via holes 3 and trenches 4 are formed in the insulating film 2 by the lithography/etching technique; and a barrier metal film (barrier layer) 5 of TaN or the like is formed on the entire surface of the substrate and a seed layer 7, which serves as a feeding layer during electroplating, is formed on the barrier layer 5.

Subsequently, as shown in FIG. 1B, copper plating is carried out on the surface of the substrate W to deposit a copper film 6 on the insulating film 2 while filling copper into the via holes 3 and the trenches 4. Thereafter, the copper film 6, the seed layer 7 and the barrier metal layer 5 on the insulating film 2 are removed by chemical mechanical polishing (CMP) to make the surface of the copper film 6, embedded in the via holes 3 and the trenches 4, approximately flush with the surface of the insulating film 2, thereby forming interconnects (copper interconnects) composed of the copper film 6 in the insulating film, as shown in FIG. 1C.

A polishing apparatus, which polishes and removes an extra conductive film (metal film), such as copper, from a substrate surface, includes a polishing table having a polishing surface, generally constituted by a polishing pad, and a top ring for holding a substrate (workpiece). In operation, while pressing a surface conductive film of a substrate, held by the top ring, against the polishing surface of the polishing table at a predetermined pressure, the polishing table and the top ring are moved relative to each other and, at the same time, a polishing liquid containing abrasive grains, such as silica ($SiO_2$), is supplied onto the polishing surface of the polishing table, thereby polishing the surface of the conductive film into a flat mirror surface.

SUMMARY OF THE INVENTION

In order to meet the demand for higher performance (higher integration and higher speed) of semiconductor devices, interconnects are increasingly becoming finer. With the progress toward finer interconnects, stricter flattening requirements are imposed on the 45-nm or later generation of semiconductor devices. For example, in a polishing process of polishing and removing an extra conductive film (metal film) from a substrate surface to form interconnects, it is common practice to set such an allowable range of erosion as not to significantly affect a circuit. The allowable range becomes narrower as interconnects become finer. Decreasing the occurrence of erosion is therefore required.

In order to prevent the occurrence of erosion, it is required to carry out polishing of a surface conductive film of a substrate at a low pressure of the conductive film on a polishing surface. The use of a low polishing pressure, however, leads to a lowered polishing rate. A longer polishing time in low-pressure polishing will result in a lower throughput or productivity. Thus, in order not to decrease the throughput while preventing the occurrence of erosion, it is required to carry out polishing at a low pressure but for the shortest possible period of time. To meet this requirement, it will be necessary not to carry out low-pressure polishing until a thickness of a conductive film of a substrate surface becomes as thin as possible.

In a polishing process of polishing and removing an extra conductive film (metal film) from a substrate surface, it is a common conventional practice to measure a thickness of the conductive film by an eddy-current sensor during polishing and, when the thickness of the conductive film has reached a predetermined value, switch the polishing operation to low-pressure polishing carried out at a lowered pressure of the conductive film on a polishing surface. When a thickness of a conductive film formed on a substrate surface is detected with an eddy-current sensor during polishing of a so-called low-resistance substrate having a low substrate resistance, a non-negligible error can be observed in the detection value.

It is noted in this regard that an ordinary semiconductor substrate is known to have a substrate resistance of not less than 1 $\Omega\cdot cm$. A low-resistance substrate, on the other hand, has a substrate resistance of, e.g., 0.03 to 0.01 $\Omega\cdot cm$. Such an ordinary substrate has a resistance error of the order of several $\Omega\cdot cm$, whereas such a low-resistance substrate has a resistance error of $\pm 0.005$ $\Omega\cdot cm$. An eddy-current sensor has the characteristic that its output is not affected by a resistance difference of the order of several $\Omega\cdot cm$ when the substrate resistance is not less than 1 $\Omega\cdot cm$, but is significantly affected by a resistance difference even of the order of $\pm 0.005$ $\Omega\cdot cm$ when the substrate resistance is at a level of 0.01 $\Omega\cdot cm$.

An eddy-current sensor is designed to measure the combined resistance of a substrate resistance and a resistance of a conductive film. Accordingly, when a thickness of a conductive film on a low-resistance substrate is detected with an eddy-current sensor, due to the above-described influence of a substrate resistance error on the output of the sensor, the detected end point of removal of the conductive film will vary among substrates. In order to measure the thickness of the conductive film taking the variation into consideration, measurement of the thickness before polishing is needed for every substrate.

The present invention has been made in view of the above situation in the related art. It is therefore an object of the present invention to provide a polishing apparatus and a polishing method, which make it possible to polish and remove an extra conductive film while preventing the occurrence of erosion and without lowering of the throughput.

In order to achieve the object, the present invention provides a polishing apparatus comprising: a polishing table having a polishing surface; a top ring for holding a workpiece having a surface of a conductive film, and pressing the workpiece against the polishing surface to polish the conductive film; an optical sensor for monitoring the polishing state of the conductive film by emitting light toward the conductive film of the workpiece held by the top ring, receiving reflected light from the conductive film, and measuring a change in the reflectance of the reflected light; and a control section for controlling a pressure at which the workpiece is pressed on the polishing surface.

It becomes possible to accurately measure a thickness of a conductive film, even when it is formed on a low-resistance substrate, by carrying out the measurement by an optical sensor which emits light to a measuring object, and calculates the thickness of the measuring object based on interference between reflected light from the measuring object and light which has passed through the measuring object and reflected off the interface between the measuring object and an underlying film or off a substrate. In particular, when the measuring object is a conductive film being polished and while it is thick, light passing through the conductive film attenuates and may not reach the interface between the conductive film and an underlying film or the substrate, that is, may not reflect off the interface or the substrate. As the conductive film becomes thin, however, light will reach and reflect off the interface between the conductive film and an underlying film or the substrate. The reflected light causes interference with reflected light from the surface of the conductive film, resulting in a change in the reflectance of reflected light received by an optical sensor. Thus, by measuring the change in the reflectance, it becomes possible to accurately measure the thickness of the conductive film without being influenced by the substrate resistance. The change in the reflectance is affected by a film underlying the conductive film. Thus, for determination of the relationship between the reflectance and the thickness of the conductive film, it is necessary to store data on physical properties of the underlying film in a memory unit of a polishing apparatus.

The following are reference reflection intensities which may be used for determination of the reflectance:

(1) Reflection intensity of bare silicon in the case of a bare silicon substrate;

(2) Reflection intensity of a substrate for actual use in polishing in the case of a non-silicon substrate such as an AlTiC substrate; and (3) Reflection intensity of a metal film (Cu, Al, W, etc.) to be polished.

The calculation of the reflectance is as follows:

Reflectance(%)=Reflection intensity of light applied to measuring object/Reference reflection intensity×100

When the reflection intensity of a metal film to be polished is used as a reference reflection intensity for the calculation of the reflectance, there is always a drop in the reflectance at a light interference initiation point. By detecting the change, the thickness of the measuring object can be measured without using data on an underlying film.

In a preferred aspect of the present invention, the optical sensor sends a signal to the control section when it detects that a thickness of the conductive film has reached a predetermined value, and the control section switches polishing conditions from first polishing conditions to second polishing conditions based on the signal.

The present inventors have found the fact that the initiation point of change in the reflectance of light having a selected wavelength, applied to a conductive film, varies depending on the thickness of the conductive film. In this connection, an experiment was conducted in which using as a sample a silicon substrate having a 500-nm thick oxide film, a 10-nm thick Ti film and a 10-nm thick TiN barrier film and a 180-nm thick tungsten film (conductive film) superimposed in this order on the substrate surface, polishing of the surface tungsten film was carried out while measuring a change in the reflectance of each of reflected lights having wavelengths of (1) 400 nm, (2) 600 nm and (3) 800 nm. As a result, as shown in FIG. 2, a change in the reflectance of the reflected light of a wavelength of 400 nm was observed when the thickness of the tungsten film had reached about 40 nm, a change in the reflectance of the reflected light of a wavelength of 600 nm was observed when the thickness of the tungsten film had reached about 65 nm, and a change in the reflectance of the reflected light of a wavelength of 800 nm was observed when the thickness of the tungsten film had reached 80 nm. The changes in the reflectances are marked in the differential values as shown in the circle A of FIG. 3.

Because of the large polishing selectivity ratio between the TiN barrier film and the underlying oxide film, the polishing rate rapidly drops upon exposure of the oxide film. The exposure of the oxide film appears as a rapid decrease of the output change in the effective value as shown in FIG. 3 and as a point at which the output change is approaching 0 (zero) in the differential value curve as shown in the circle B of FIG. 3. Thus, the removal of the barrier film can be detected by detecting the point at which the output change is approaching 0 in the differential value curve. The point of time at which the differential value curve is approaching 0 defers with the wavelength of the light used. Light having a longer wavelength, i.e., 800 nm in this experiment, will be advantageously used in actual polishing because the differential value curve approaches 0 at an earlier time, which will less cause erosion.

Another experiment was conducted in which using as a sample a silicon substrate having a 500-nm thick oxide film, a 10-nm thick Ta barrier film and a 180-nm thick copper film (conductive film) superimposed in this order on the substrate surface, polishing of the surface copper film was carried out while measuring a change in the reflectance of each of reflected lights having wavelengths of (1) 400 nm, (2) 600 nm and (3) 800 nm. As a result, as shown in FIG. 4, a change in the reflectance was observed when the thickness of the copper film had reached about 100 nm. The reflectance of the light having a wavelength of 400 nm shows a maximum value at the copper film thickness of about 60 nm. The thickness of the remaining conductive film may also be detected by detecting such a change point after the initiation of light interference.

By utilizing the above phenomena and observing a change in the reflectance of reflected light having a specified wavelength, it becomes possible to accurately detect that a thickness of a conductive film, such as a tungsten or copper film, has reached a predetermined value, and then switch polishing conditions.

Preferably, the pressure, at which the workpiece is pressed on the polishing surface, is smaller in the second polishing conditions than in the first polishing conditions.

Thus, polishing can be switched from normal polishing to low-pressure polishing on accurate detection of the thickness of the conductive film having reached a predetermined value.

In a preferred aspect of the present invention, the optical sensor measures a change in the reflectance under the second polishing conditions using a wavelength different from that used for measuring a change in the reflectance under the first polishing conditions.

In a preferred aspect of the present invention, the conductive film is a tungsten film, and the optical sensor detects a change in the reflectance of reflected light having a wavelength of 190 to 800 nm.

In a preferred aspect of the present invention, the optical sensor sends a signal to the control section when the optical sensor detects that the thickness of the tungsten film has reached 80 nm.

As described above, it is possible to detect that the thickness of the tungsten film has reached about 80 nm by measuring a change in the reflectance of reflected light having a wavelength of 800 nm, that the thickness of the tungsten film has reached about 65 nm by measuring a change in the reflectance of reflected light having a wavelength of 600 nm, and that the thickness of the tungsten film has reached about 40 nm by measuring a change in the reflectance of reflected light having a wavelength of 400 nm.

In a preferred aspect of the present invention, the conductive film is a copper film, and the optical sensor detects a change in the reflectance of reflected light having a wavelength of 190 to 800 nm.

In a preferred aspect of the present invention, the optical sensor sends a signal to the control section when the optical sensor detects that the thickness of the copper film has reached not more than 100 nm.

As described above, it is possible to detect that the thickness of the copper film has reached about 100 nm by measuring a change in the reflectance of reflected light having a wavelength of 600 nm or 800 nm, and that the thickness of the copper film has reached about 60 nm by measuring a change in the reflectance of reflected light having a wavelength of 400 nm.

The present invention also provides a polishing method comprising: polishing a surface of a conducting film of a workpiece by pressing the conductive film against a polishing surface at a predetermine pressure; monitoring the polishing state of the conductive film with an optical sensor by emitting light toward the conductive film, receiving reflected light from the conductive film, and measuring a change in the reflectance of the reflected light; and switching polishing conditions from first polishing conditions to second polishing conditions when the optical sensor detects that the thickness of the conductive film has reached a predetermined value.

Preferably, the pressure, at which the conductive film of the workpiece is pressed against the polishing surface, is smaller in the second polishing conditions than in the first polishing conditions.

In a preferred aspect of the present invention, the optical sensor measures a change in the reflectance under the second polishing conditions using a wavelength different from that used for measuring a change in the reflectance under the first polishing conditions.

The present invention makes it possible to accurately measure a thickness of a surface conductive film of a substrate without being influenced by the substrate resistance, even when the conductive film is formed on a low-resistance substrate, by carrying out the measurement by an optical sensor which utilizes a change in the reflectance of reflected light from the conductive film. This makes it possible to minimize low-pressure polishing time and remove an extra conductive film while preventing the occurrence of erosion and without lowering of the throughput.

BRIEF DESCRIPTION OF THE DRAWINGS

FIG. 2 is a graph showing a change in the reflectance of each of reflected lights having wavelengths of (1) 400 nm, (2) 600 nm and (3) 800 nm, as measured during polishing of a tungsten film;

DETAILED DESCRIPTION OF THE INVENTION

Preferred embodiments of the present invention will now be described with reference to the drawings.

Figure 5:
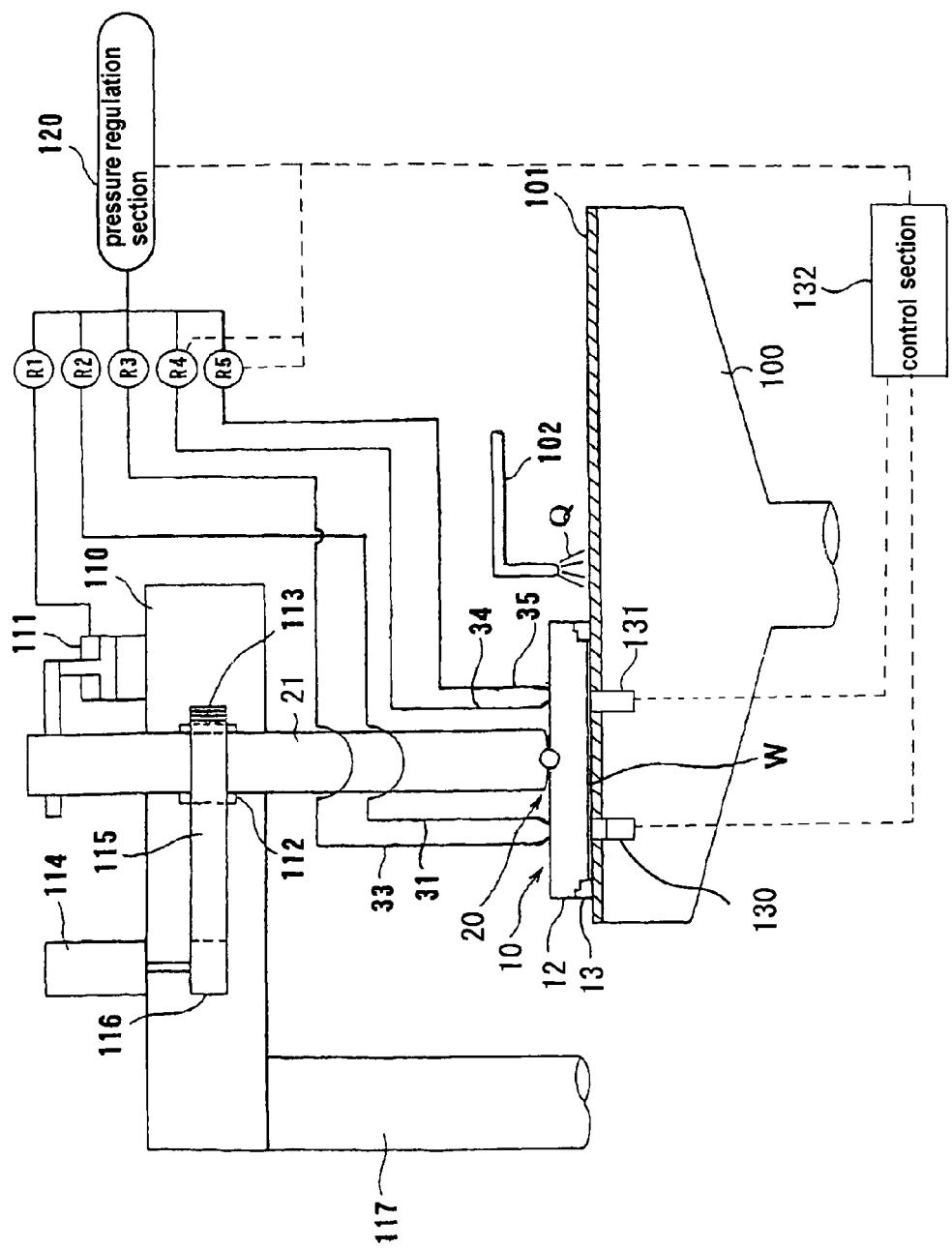
FIG. 5 is a cross-sectional diagram showing the overall construction of a polishing apparatus according to an embodiment of the present invention.

FIG. 5 is a cross-sectional diagram showing the overall construction of a polishing apparatus according to an embodiment of the present invention. As shown in FIG. 5, below a top ring 10 is disposed a polishing table 100 on which is attached a polishing pad 101 comprising a polishing surface. Above the polishing table 100 is disposed a polishing liquid supply nozzle 102 which supplies a polishing liquid Q onto the polishing pad (polishing surface) 101 on the polishing table 100.

Various commercially-available polishing pads can be used as the polishing pad 101. Examples include SUBA800, IC-1000 and IC-1000/SUBA400 (two-layer cloth), manufactured by Rohm and Haas, Inc. and Nitta Haas, Inc., and Surfin xxx-5 and Surfin 000, manufactured by Fujimi Incorporated. SUBA800, Surfin xxx-5 and Surfin 000 are non-woven fabrics each comprising fibers fixed with a polyurethane resin, and IC-1000 is a rigid foamed polyurethane (single layer). The foamed polyurethane is porous, having numerous fine recesses or holes in a surface.

The top ring 10 is connected via a universal joint 20 to a top ring drive shaft 21, and the top ring drive shaft 21 is coupled to a top ring air cylinder 111 secured to a top ring head 110. The top ring air cylinder 111 operates to move the top ring drive shaft 21 vertically to thereby lift and lower the top ring 10 as a whole and to press a retainer ring 13 fixed to a lower end of a top ring body 12 against the polishing table 100. The top ring air cylinder 111 is connected via a regulator R1 to a pressure regulation section 120. The pressure regulation section 120 regulates a pressure by supplying a pressurized fluid, such as pressurized air, from a compressed air source or by evacuating by a pump or the like. The pressure of a pressurized fluid, such as pressurized air, supplied to the top ring air cylinder 111 from the pressure regulation section 120, can be regulated by the regulator R1, whereby the pressure of the retainer ring 13 on the polishing pad 101 can be adjusted.

The top ring drive shaft 21 is mounted via a key (not shown) to a rotating cylinder 112. The rotating cylinder 112 is provided with a timing pulley 113 fixedly disposed at a peripheral portion thereof. A top ring motor 114 is secured to the top ring head 110. The timing pulley 113 is connected to a timing pulley 116 mounted on the top ring motor 114 via a timing belt 115. Thus, by rotationally driving the top ring motor 114, the rotating cylinder 112 and the top ring drive shaft 21 rotate integrally by the timing pulley 116, the timing belt 115 and the timing pulley 113, whereby the top ring 10 rotates. The top ring head 110 is supported by a top ring head shaft 117 secured to a frame (not shown).

Figure 6:
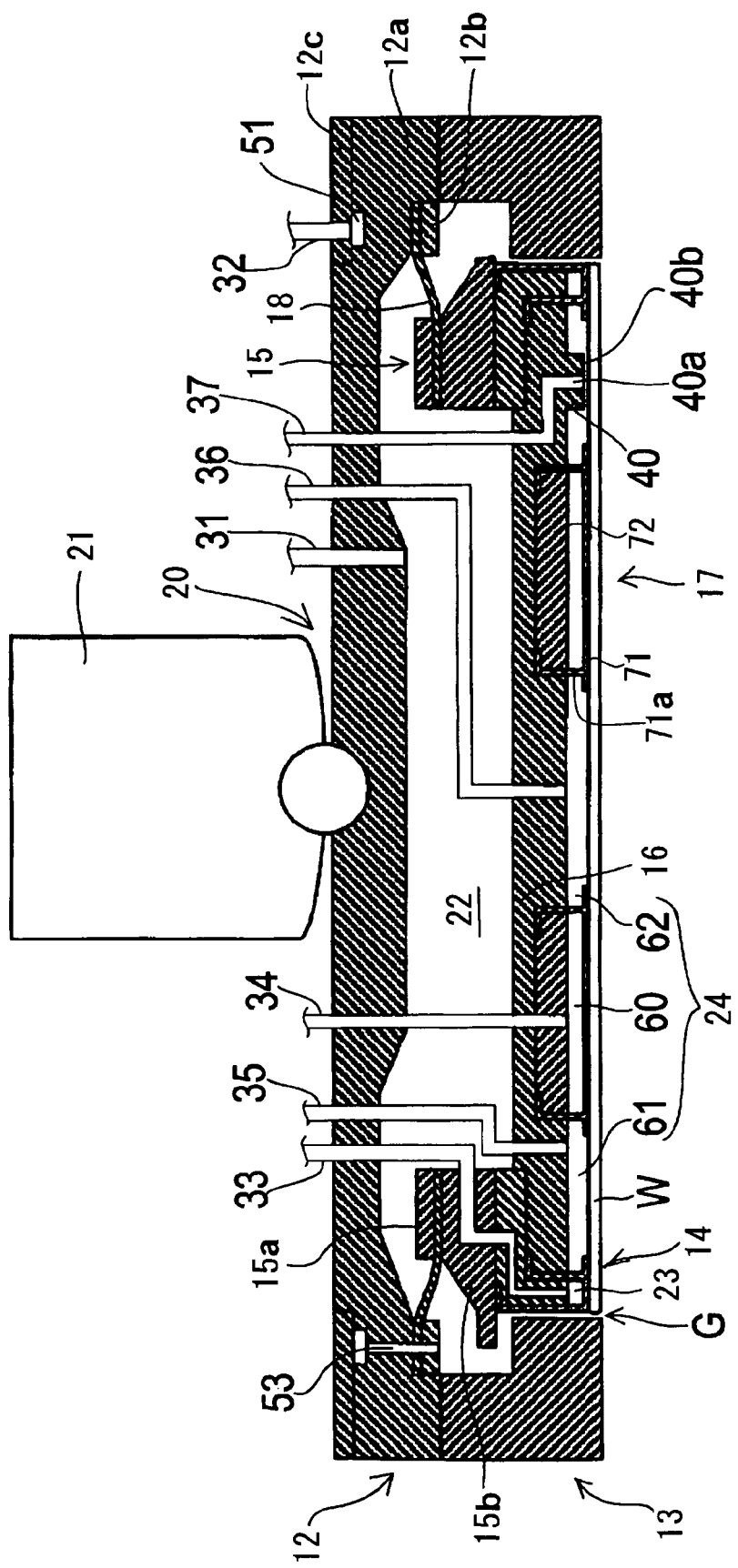
FIG. 6 is a vertical sectional view of a top ring for use in the polishing apparatus of FIG. 5.

FIG. 6 is a vertical sectional view of the top ring 10. The top ring 10 includes a top ring body 12 in the form of a cylindrical vessel with a receiving space defined therein, and the retainer ring 13 fixed to the lower end of the top ring body 12. The top ring body 12 is formed of, for example, a material having high strength and high rigidity, such as a metal or a ceramic. The retainer ring 13 is formed of, for example, a resin having high rigidity or a ceramic.

The top ring body 12 includes a housing portion 12a in the form of a cylindrical vessel, an annular pressurizing sheet support portion 12b fitted in the cylindrical portion of the housing portion 12a, and an annular sealing portion 12c fitted into a peripheral portion of the upper surface of the housing portion 12a. The retainer ring 13 is fixed to the lower end of the housing portion 12a of the top ring body 12. The retainer ring 13 has a lower portion projecting radially inwardly. The retainer ring 13 may be formed integrally with the top ring body 12.

The above-described top ring drive shaft 21 is provided above the center of the housing portion 12a of the top ring body 12. The top ring body 12 and the top ring drive shaft 21 are coupled by the universal joint 20. The universal joint 20 includes a spherical bearing mechanism which allows the top ring body 12 and the top ring drive shaft 21 to tilt with respect to each other, and a rotation transmitting mechanism which transmits the rotation of the top ring drive shaft 21 to the top ring body 12. Thus, the universal joint 20, while permitting tilting of the top ring body 12 with respect to the top ring drive shaft 21, transmits the pressure and the torque of the top ring drive shaft 21 to the top ring body 12.

In the interior space defined by the top ring body 12 and the retainer ring 13 fixed integrally to the top ring body 12, there are housed an edge bag 14 having a lower surface to be brought into contact with a peripheral portion of a substrate (workpiece) W, such as semiconductor wafer, held by the top ring 10, an annular holder ring 15, a generally disk-shaped chucking plate 16 which is vertically movable within the receiving space in the top ring body 12, and a torque transmitting member 17 having a lower surface to be brought into contact with the substrate W at a radially inward position of the edge bag 14.

The chucking plate 16 may be made of metal material or non-magnetic material, e.g., an insulating material such a fluororesin or a ceramic.

A pressurizing sheet 18 comprising an elastic membrane extends between the holder ring 15 and the top ring body 12. The pressurizing sheet 18 is fixed with its one end nipped between the housing portion 12a and the pressurizing sheet support portion 12b of the top ring body 12, and the other end nipped between an upper end portion 15a and a stopper portion 15b of the holder ring 15. The top ring body 12, the chucking plate 16, the holder ring 15, and the pressurizing sheet 18 jointly define a pressure chamber 22 in the top ring body 12. A fluid passage 31 comprising tubes and connectors communicates with the pressure chamber 22, which is connected to the pressure regulation section 120 via a regulator R2 provided on the fluid passage 31. The pressurizing sheet 18 is made of a highly strong and durable rubber material such as ethylene propylene rubber (EPDM), polyurethane rubber, or silicone rubber.

A cleaning liquid passage 51 in the form of an annular groove is defined in the upper surface of the housing portion 12a near its outer circumferential edge into which the seal portion 12c of the top ring body 12 is fitted. The cleaning liquid passage 51 communicates with a fluid passage 32 via a through-hole formed in the seal portion 12c, and is supplied with a cleaning liquid (pure water) via the fluid passage 32. A plurality of through-holes 53 are defined in the housing portion 12a and the pressurizing sheet support portion 12b in communication with the cleaning liquid passage 51. The through-holes 53 communicate with a small gap G defined between the outer circumferential surface of the edge bag 14 and the inner circumferential surface of the retainer ring 13.

A lower end surface of the edge bag 14 is brought into contact with a peripheral portion of the substrate W, such as semiconductor wafer, as a workpiece. The edge bag 14 comprises, for example, an elastic membrane made of a highly strong and durable rubber material such as ethylene propylene rubber (EPDM), polyurethane rubber, or silicone rubber.

The edge bag 14 has a (first) pressure chamber 23 defined therein by the above-described elastic membrane. A fluid passage 33 comprising tubes and connectors communicates with the pressure chamber 23. The pressure chamber 23 is connected to the pressure regulation section 120 via a regulator R3 connected to the fluid passages 33.

Upon polishing, the substrate W is rotated in accordance with rotation of the top ring 10. Since the aforementioned edge bag 14 has a small contact area with the substrate W, rotational torque may fails to completely be transmitted to the substrate W. Accordingly, the torque transmitting member 17 is secured to the chucking plate 16 for transmitting sufficient torque to the substrate W by abutment with the substrate W. The torque transmitting member 17 is in the form of an annular bag and is brought into contact with the substrate W with a contact area large enough to transmit sufficient torque to the substrate W.

The torque transmitting member 17 comprises an elastic membrane 71 to be brought into contact with the upper surface of the substrate W, and a torque transmitting member holder 72 for detachably holding the elastic membrane 71 in position. The torque transmitting member 17 has a space 60 defined therein by the elastic membrane 71 and the torque transmitting member holder 72. The elastic membrane 71 of the torque transmitting member 17 is made of a highly strong and durable rubber material such as ethylene propylene rubber (EPDM), polyurethane rubber, or silicone rubber, as with the edge bag 14.

The elastic membrane 71 of the torque transmitting member 17 has connecting portions 71a to be connected via the torque transmitting member holder 72 to the chucking plate 16. The connecting portions 71a have a plurality of through-holes (not shown) provided at radially inward and outward positions, and the interior of the internal space 60 of the torque transmitting member 17 is communicated with external spaces 61, 62.

The space defined between the chucking plate 16 and the substrate W is divided into a plurality of spaces, i.e., a pressure chamber 23 disposed radially inwardly of the edge bag 14, the space 60 in the torque transmitting member 17, a space 61 between the edge bag 14 and the torque transmitting member 17, and a space 62 disposed radially inwardly of the torque transmitting member 17. As described above, the through-holes are provided in the connecting portions 71a of the torque transmitting member 17. Accordingly, the space 61, the space 60, and the space 62 are communicated with each other through the through-holes, so that a (second) pressure chamber 24 is formed radially inwardly of the edge bag 14.

A fluid passage 34 comprising tubes and connectors communicates with the space 60 in the torque transmitting member 17. The space 60 is connected to the pressure regulation section 120 via a regulator R4 connected to the fluid passages 34. A fluid passage 35 comprising tubes and connectors communicates with the space 61 between the edge bag 14 and the torque transmitting member 17. The space 61 is connected to the pressure regulation section 120 via a regulator R5 connected to the fluid passages 35. A fluid passage 36 comprising tubes and connectors communicates with the space 62 disposed radially inwardly of the torque transmitting member 17. The space 62 is connected to the pressure regulation section 120 via a regulator (not shown) connected to the fluid passages 36. The pressure chambers 22 to 24 are connected to the respective regulators through a rotary joint (not shown) mounted on the upper end of the top ring shaft 110.

Since the space 61, the space 60, and the space 62 are communicated with each other, as described above, one fluid passage can supply a pressurized fluid so as to uniformly control the pressure of the pressure chamber 24 without a plurality of fluid passages. However, in order to obtain good responsiveness when the pressure of the pressure chamber 24 is varied, it is desirable to provide a plurality of fluid passages 34, 35, 36. It is not necessary to provide regulators for the respective fluid passages 34, 35, 36, and the fluid passages 34, 35, 36 may be connected to one regulator to control the pressure.

The pressure chamber 22 above the chucking plate 16 and the pressure chambers 23, 24 are supplied with pressurized fluids such as pressurized air or atmospheric air or evacuated, via the fluid passages 31, 33, 34 to 36 connected to the respective pressure chambers. Specifically, the regulators connected to the fluid passages 31, 33, 34 to 36 of the pressure chambers 22 to 24 can respectively regulate the pressures of the pressurized fluids supplied to the respective pressure chambers. Thus, it is possible to independently control the pressures in the pressure chambers 22 to 24 or independently introduce atmospheric air or vacuum into the pressure chambers 22 to 24. With this arrangement, the pressures of the pressure chamber 24 can press the entire surface of the substrate W except the peripheral portion thereof at a uniform force, and the pressure of the pressure chamber 23 can be controlled independently of the pressure of the pressure chamber 24. Therefore, it is possible to control a polishing rate at the peripheral portion of the substrate W, i.e., a polishing profile of the peripheral portion of the substrate W. Additionally, when the pressing force of the retainer ring 13 is controlled, more detailed control can be achieved.

The chucking plate 16 has suction portions 40 extended downwardly therefrom between the edge bag 14 and the torque transmitting member 17. In the present embodiment, four suction portions 40 are provided. The suction portions 40 have through-holes 40a communicating with a fluid passage 37 comprising tubes and connectors. The suction portions 40 are connected to the pressure regulation section 120 via a regulator (not shown) connected to the fluid passage 37. The pressure regulation section 120 can develop a negative pressure at the lower opening ends of the through-holes 40a of the suction portions 40 to attract a substrate W to the lower ends of the suction portions 40. The suction portions 40 have elastic sheets 40b, such as thin rubber sheets, attached to their lower ends, for thereby elastically contacting and holding the substrate W on the lower surfaces thereof.

Figure 1A:
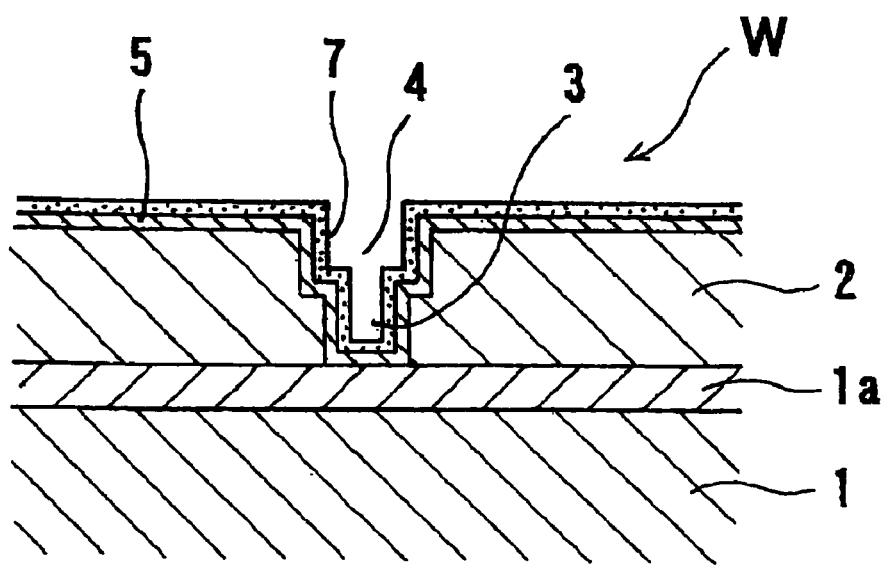
FIGS. 1A through 1C are diagrams illustrating, in a sequence of process steps, a dual damascene process for producing copper interconnects.
Figure 1B:
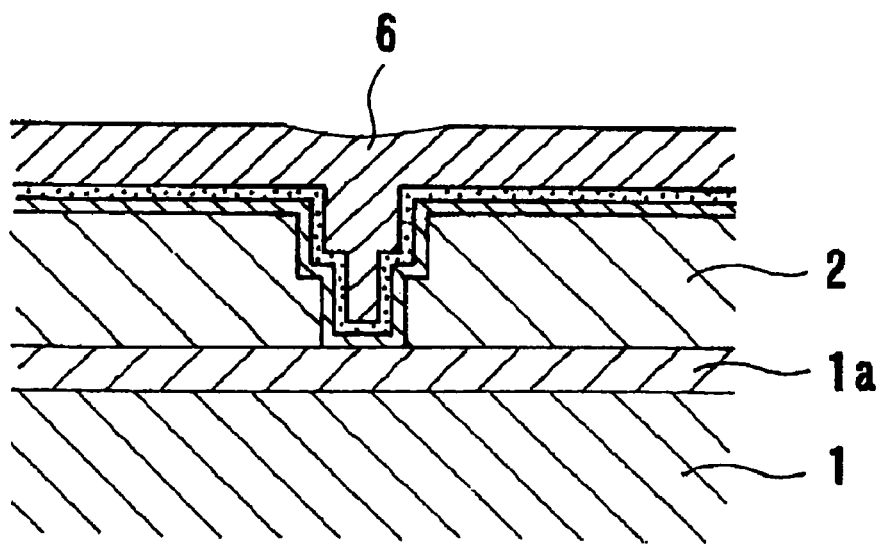
Figure 1C:
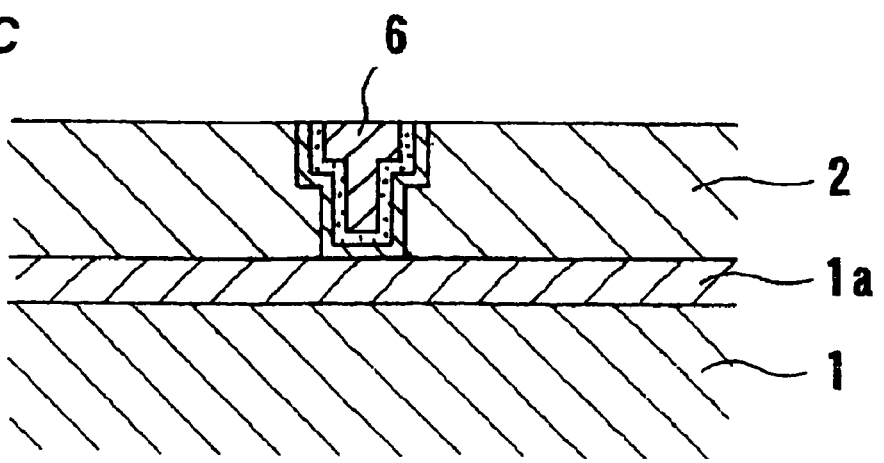

In the polishing table 100 is embedded an upwardly-open optical sensor 130 for monitoring the polishing state of a surface conductive film, such as the copper film 6 shown in FIG. 1A, of the substrate W when polishing of the conductive film is carried out by pressing and rubbing the conductive film of the substrate W, held by the top ring 10, against the polishing pad (polishing surface) 101. An opening is provided in the polishing pad 101 at a position corresponding to the position at which the optical sensor 130 is embedded. An output signal from the optical sensor 130 is inputted into a control section 132, and the pressure regulation section 120 and the regulators R1 to R5 are controlled by an output signal from the control section 132, so that a pressure, at which the substrate W, held by the top ring 10, is pressed against the polishing pad 101 of the polishing table 100, is controlled.

The optical sensor 130 includes a light source for emitting light toward a measuring object, and a light-receiving section for receiving light that has reflected from the measuring object and reflected light that has passed through the measuring object, and calculates a thickness of the measuring object based on a change in the reflectance caused by interference between the light that has reflected from the measuring object and the reflected light that has passed through the measuring object. In this embodiment, a multi-wavelength light source, such as a white light source, is used as the light source, and the reflected light is dispersed into a spectrum in order to observe a change in the reflectance of light having a specified wavelength. It is also possible to use a plurality of single-wavelength light sources.

When the measuring object is a conductive film being polished, such as the copper film 6 shown in FIG. 1A, and while the conductive film is thick, light passing through the conductive film attenuates and may not reach the interface between the conductive film and an underlying film or the substrate, that is, may not reflect off the interface or the substrate. As the conductive film becomes thin, however, light will reach and reflect off the interface between the conductive film and an underlying film or the substrate. The reflected light causes interference with reflected light from the surface of the conductive film, resulting in a change in the reflectance of reflected light received by the optical sensor 130. By thus using the optical sensor 130 which utilizes such a change in the reflectance to measure a thickness of an object, it becomes possible to accurately measure a thickness of a surface conductive film of a substrate without being influenced by the substrate resistance even when the substrate is a low-resistance substrate.

Figure 3:
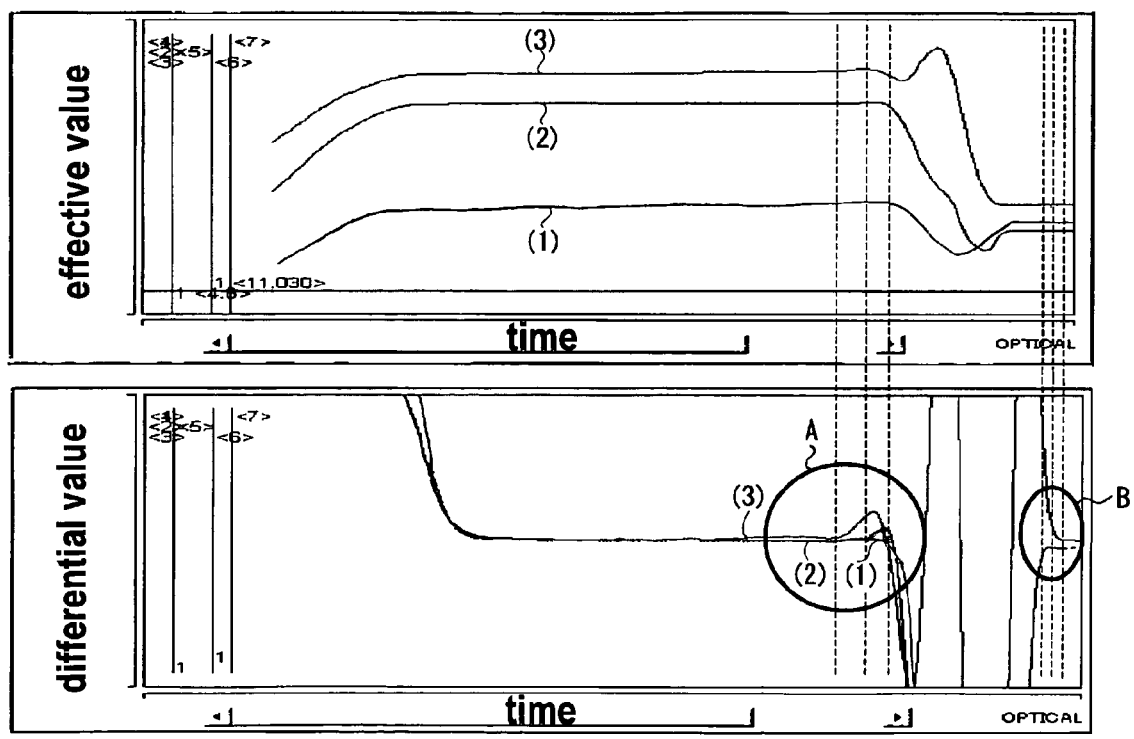
FIG. 3 is a graph showing a change in the reflectance, expressed in term of the effective value and the corresponding differential value, of each of lights having wavelengths of (1) 400 nm, (2) 600 nm and (3) 800 nm, as measured during polishing of a tungsten film.

In particular, as described above with reference to FIGS. 2 and 3, when polishing of a tungsten film is carried out while measuring a change in the reflectance of each of reflected lights having wavelengths of (1) 400 nm, (2) 600 nm and (3) 800 nm, a change in the reflectance will be observed when a thickness of the tungsten film reaches about 80 nm. The reflectance of the reflected light having a wavelength of 400 nm shows a maximum value at the tungsten film thickness of about 20 nm. The thickness of the remaining conductive film can be detected by detecting such a change point after the initiation of light interference. The reflected light having a wavelength of 600 nm shows a marked rise in the reflectance as the thickness of the tungsten film reaches about 65 nm. Thus, by setting a threshold value, the thickness of the remaining film can be detected.

Figure 4:
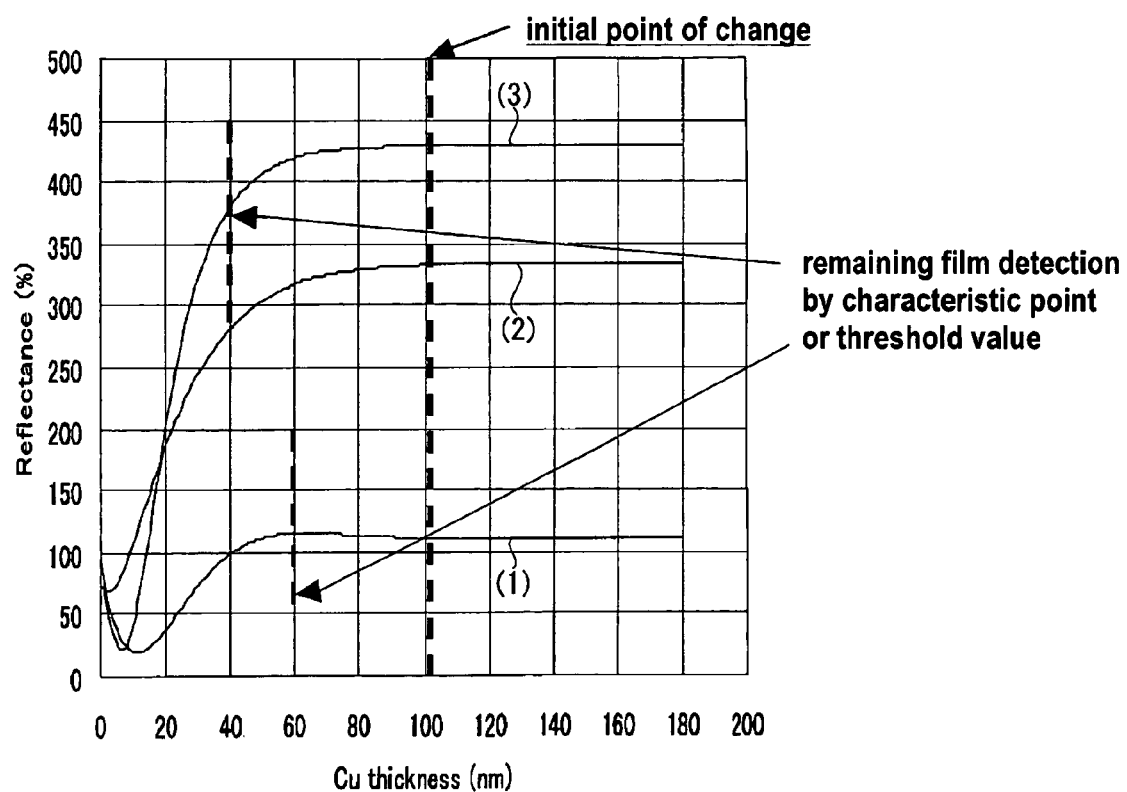
FIG. 4 is a graph showing a change in the reflectance of each of reflected lights having wavelengths of (1) 400 nm, (2) 600 nm and (3) 800 nm, as measured during polishing of a copper film.

Further, as described above with reference to FIG. 4, when polishing of a copper film is carried out while measuring a change in the reflectance of each of reflected lights having wavelengths of (1) 400 nm, (2) 600 nm and (3) 800 nm, a change in the reflectance will be observed when a thickness of the copper film reaches about 100 nm. The reflectance of the reflected light having a wavelength of 400 nm shows a maximum value at the copper film thickness of about 60 nm. The thickness of the remaining conductive film can be detected by detecting such a change point after the initiation of light interference.

Thus, the polishing state of a conductive film during its polishing can be monitored by continually measuring changes in the reflectances of a plurality of reflected lights having different specific wavelengths by the optical sensor 130.

The change in the reflectance is affected by a film underlying the conductive film. Thus, for determination of the relationship between the reflectance and the thickness of the conductive film, it is necessary to store data on physical properties of the underlying film in a memory unit of the control section 132. However, when the reflection intensity of a metal film to be polished is used as a reference reflection intensity for the calculation of the reflectance, there is always a drop in the reflectance at a light interference initiation point. By detecting the change, the thickness of the metal film can be measured without using data on an underlying film.

As shown in FIG. 5, in addition to the optical sensor 130, it is preferred to concomitantly use an eddy-current sensor 131 or a torque sensor (not shown), which detects the rotary torque of the polishing table 100, for monitoring of the polishing state of a conductive film. In this regard, the optical sensor 130 can measure a thickness of a conductive film after the thickness has become, e.g., not more than 100 nm. Thus, it is not possible to detect a change in the thickness of the conductive film during most of polishing. The concomitant use of the eddy-current sensor 131 enables detection of a change in the relative thickness of the conductive film, though detection of the absolute thickness is difficult unless the initial film thickness is not measured. For example, the polishing rate can be calculated from a signal of the eddy-current sensor 131.

Further, the concomitant use of the eddy-current sensor 131 can deal with false detection of the optical sensor 130. In particular, the eddy-current sensor 131 can measure a relative thickness of a conductive film even without measurement of the initial film thickness, and the output decreases as the conductive film becomes thinner. Thus, even in a case where due to an output noise, the optical sensor 130 makes false detection of a change in reflection intensity when the output of the eddy-current sensor 130 is decreasing, the false detection can be found out by confirming that the output of the eddy-current sensor 131 keeps decreasing.

Depending on the polishing conditions, the rotary torque of the polishing table 100 changes upon removal of a conductive film. In this case, a table torque sensor may be used concomitantly with the optical sensor 130 to detect the end point of removal of the conductive film. Even when the optical sensor 130 determines the end point of removal of the conductive film, the determination will be cancelled as a false detection unless the torque sensor detects the end point of removal of the conductive film when the torque sensor is concomitantly used with the optical sensor 130, and vice versa. The point of time when detection by the both sensors of the end point of removal of the conductive film is completed, can be taken as the true end point of polishing.

The operation of the polishing apparatus having the above-described construction will now be described in detail.

Upon transport of a substrate W, the top ring 10 is positioned at a substrate transport position, and the through-holes 40a of the suction portions 40 are connected via the fluid passage 37 to the pressure regulation section 120. The substrate W is vacuum-attracted to the lower end surfaces of the suction portions 40 by the sucking action of the through-holes 40a. The top ring 10, with the substrate W attracted thereto, is then moved to a position above the polishing surface (polishing pad 101) of the polishing table 100. The edge portion of the substrate W is held by the retainer ring 13 so that the substrate W will not escape from the top ring 10.

During polishing of the substrate W, the suction of the substrate W to the suction portions 40 is released and, while holding the substrate W on the lower surface of the top ring 10, the top ring air cylinder 111, coupled to the top ring drive shaft 21, is actuated to press the retainer ring 13, secured to the lower end of the top ring 10, against the polishing surface of the polishing table 100 at a predetermined pressure. In this state, pressurized fluids, each at a predetermined pressure, are respectively supplied to the pressure chamber 23 and the pressure chamber 24 so as to press a surface conductive film, such as the copper film 6 (see FIG. 1A), of the substrate W against the polishing surface of the polishing table 100 at a predetermined pressure (first pressure). Supply of a polishing liquid Q from the polishing liquid supply nozzle 102 is started before the initiation of polishing so that the polishing liquid Q is held in the polishing pad 101, and polishing under first polishing conditions is carried out in the presence of the polishing liquid Q between the polishing pad 101 and the lower surface of the substrate W, i.e., the surface of the conductive film, such as the copper film 6.

Those portions of the substrate W, which lie under the pressure chamber 23 and the pressure chamber 24, are pressed against the polishing surface by the pressures of the pressurized fluids supplied to the pressure camber 23 and the pressure chamber 24, respectively. Accordingly, by controlling the respective pressures of the pressurized fluids supplied to the pressure chamber 23 and the pressure chamber 24, the entire surface of the substrate W, except the peripheral portion, can be pressed against the polishing surface at a uniform pressure and, in addition, the polishing rate and thus the polishing profile in the peripheral portion of the substrate W can be controlled. Similarly, the pressure of the retainer ring 13 on the polishing pad 101 can be changed or controlled by regulating with the regulator R1 the pressure of the pressurized fluid supplied to the air cylinder 111. Polishing of the substrate W is thus carried out while appropriately regulating the pressure of the retainer ring 13 on the polishing pad 101 by the top ring air cylinder 111 and the pressure of the substrate W on the polishing pad 101 by the pressurized fluids supplied to the pressure chamber 23 and the pressure chamber 24.

During the polishing, the polishing state of the surface conductive film, such as the copper film 6, of the substrate W is monitored with the optical sensor 130. In particular, light (multi-wavelength light) is emitted from the light source of the optical sensor 130, and reflected light from the conductive film is received by the light-receiving section. The reflected light is dispersed into a spectrum, and a change in the reflectance of light having a specified wavelength is measured (monitored). When the optical sensor 130 detects that a thickness of the conductive film has reached a predetermined value, the polishing conditions are changed from the first polishing conditions to second polishing conditions.

In particular, as described above, when the conductive film is a tungsten film, a change in the reflectance will be observed when a thickness of the tungsten film reaches about 80 nm. The reflectance of reflected light having a wavelength of 400 nm shows a maximum value at the tungsten film thickness of about 20 nm. The thickness of the remaining conductive film can be detected by detecting such a change point after the initiation of light interference. The reflected light having a wavelength of 600 nm shows a marked rise in the reflectance as the thickness of the tungsten film reaches about 65 nm. Thus, by setting a threshold value, the thickness of the remaining film can be detected. For example, when the optical sensor 130 detects from the initiation point of light interference that the thickness of the tungsten film (conductive film) has reached 80 nm, the polishing conditions are switched from the first polishing conditions to second polishing conditions.

When the conductive film is a copper film, a change in the reflectance will be observed when a thickness of the copper film reaches about 100 nm. The reflectance of reflected light having a wavelength of 400 nm shows a maximum value at the copper film thickness of about 60 nm. The thickness of the remaining conductive film can be detected by detecting such a change point after the initiation of light interference. For example, when the optical sensor 130 detects from the initiation point of light interference that the thickness of the copper film (conductive film) has reached 100 nm, the polishing conditions are switched from the first polishing conditions to second polishing conditions.

In the second polishing conditions, the pressure (second pressure) of the surface conductive film, such as the copper film 6, of the substrate W on the polishing surface (polishing pad 101) is made lower than the pressure (first pressure) in the first polishing conditions. That is, the pressures of the pressurized fluids supplied to the pressure chamber 23 and the pressure chamber 24 are lowered. This enables low-dishing, low-erosion and low-scratching polishing.

By thus using the optical sensor 130, which utilizes a change in the reflectance, in the measurement of a thickness of a surface conductive film of a substrate, it becomes possible to accurately measure the thickness of the conductive film without being influenced by the substrate resistance, even when the substrate is a low-resistance substrate. Further, by switching polishing conditions to low-pressure polishing conditions when the thickness of the conductive film has reached a predetermined value, it becomes possible to minimize low-pressure polishing time and remove the extra conductive film while preventing the occurrence of erosion and without lowering of the throughput.

After detecting with the optical sensor 130 complete removal of the extra surface conductive film, such as the copper film 6, of the substrate W, over-polishing is carried out as necessary to securely remove the conductive film possibly remaining locally on the substrate W. The over-polishing is carried out for a predetermined time under predetermined conditions. Further, unlike the above-described polishing under the first polishing conditions and polishing under the second polishing conditions, end point detection with a sensor and change of polishing conditions are not carried out during the over-polishing.

The above-described polishing process is summarized as follows:

(1) First Step (Polishing Under First Polishing Conditions)

The conductive film is polished by pressing it against the polishing surface at a predetermined pressure (first pressure) until the thickness of the conductive film reaches a predetermined value (polishing under first polishing conditions). The predetermined (desired) thickness of the conductive film may be determined by the structure of the semiconductor wafer, the optimal film thickness for the polishing process, and the like. The optical sensor 130 is used to detect the predetermined thickness of the remaining film.

(2) Second Step (Polishing Under Second Polishing Conditions)

After detecting with the optical sensor 130 that the thickness of the conductive film has reached the predetermined value, the conductive film is polished by pressing it against the polishing surface at a predetermined pressure (second pressure) which is made lower than the first pressure in order to meet strict flattening requirements (polishing under second polishing conditions). That is, the high-pressure polishing conditions in the first step are switched to low-pressure polishing conditions. This enables low-dishing, low-erosion and low-scratching polishing. Though the optical sensor 130 is used to detect the end point of second-step polishing, it is also possible to use an eddy-current sensor or a torque sensor.

(3) Over-Polishing

Over-polishing (O.P.) is optionally carried out for a predetermined time under predetermined conditions in such a manner as not to cause erosion exceeding an allowable range. Unlike the first step and the second step, end point detection with a sensor and change of polishing conditions are not carried out during over-polishing.

Upon completion of polishing, the substrate W is again vacuum-attracted to the lower end surfaces of the suction portions 40 of the top ring 10. Upon the vacuum attraction, the supply of the pressurized fluids to the pressure chamber 23 and the pressure chamber 24 is stopped and the chambers are opened to atmospheric pressure, thereby bringing the lower surfaces of the suction portions 40 into contact with the substrate W. The pressure chamber 22 is either opened to atmospheric pressure or its internal pressure is made negative. This is because if the internal pressure of the pressure chamber 22 is kept high, only those portions of the substrate W, which are in contact with the suction portions 40, will be strongly pressed on the polishing surface.

After attracting the substrate W to the suction portions 40 in the above-described manner, the top ring 10 as a whole is moved to the substrate transport position, where the substrate W is released from the top ring 10 by jetting a fluid (e.g., a mixture of pressurized air or nitrogen gas with pure water) to the substrate W from the through-holes 40*a* of the suction portions 40.

The polishing liquid Q used in polishing intrudes into the small gap G between the retainer ring 13 and the outer circumferential surface of the edge bag 14. The polishing liquid Q, if it adheres to the retainer ring 13 and the edge bag 14 and remains in the gap G, will hinder smooth vertical movement of such members as the holder ring 15, the chucking plate 16 and the edge bag 14 relative to the top ring body 12 and the retainer ring 13. A cleaning liquid (pure water) is therefore supplied through the fluid passage 32 to the cleaning liquid passage 51. The cleaning liquid passes through a plurality of through-holes 53 and is supplied from above to the gap G. The cleaning liquid cleans off the gap G, thus preventing the above-described adhesion of the polishing liquid Q. The cleaning liquid (pure water) is preferably supplied after release of a polished substrate from the top ring 10 and before attraction of the next substrate to be polished to the top ring 10.

Various modifications can be made to the top ring 10 of this embodiment depending on the degree of pressure to be applied on a substrate W, the positions on the substrate W on which pressure is to be applied, etc. For example, the separate fluid passages 31 and 33 to 37 may be integrated. Further, the respective pressure chambers may be designed to communicate with each other.

Figure 7:
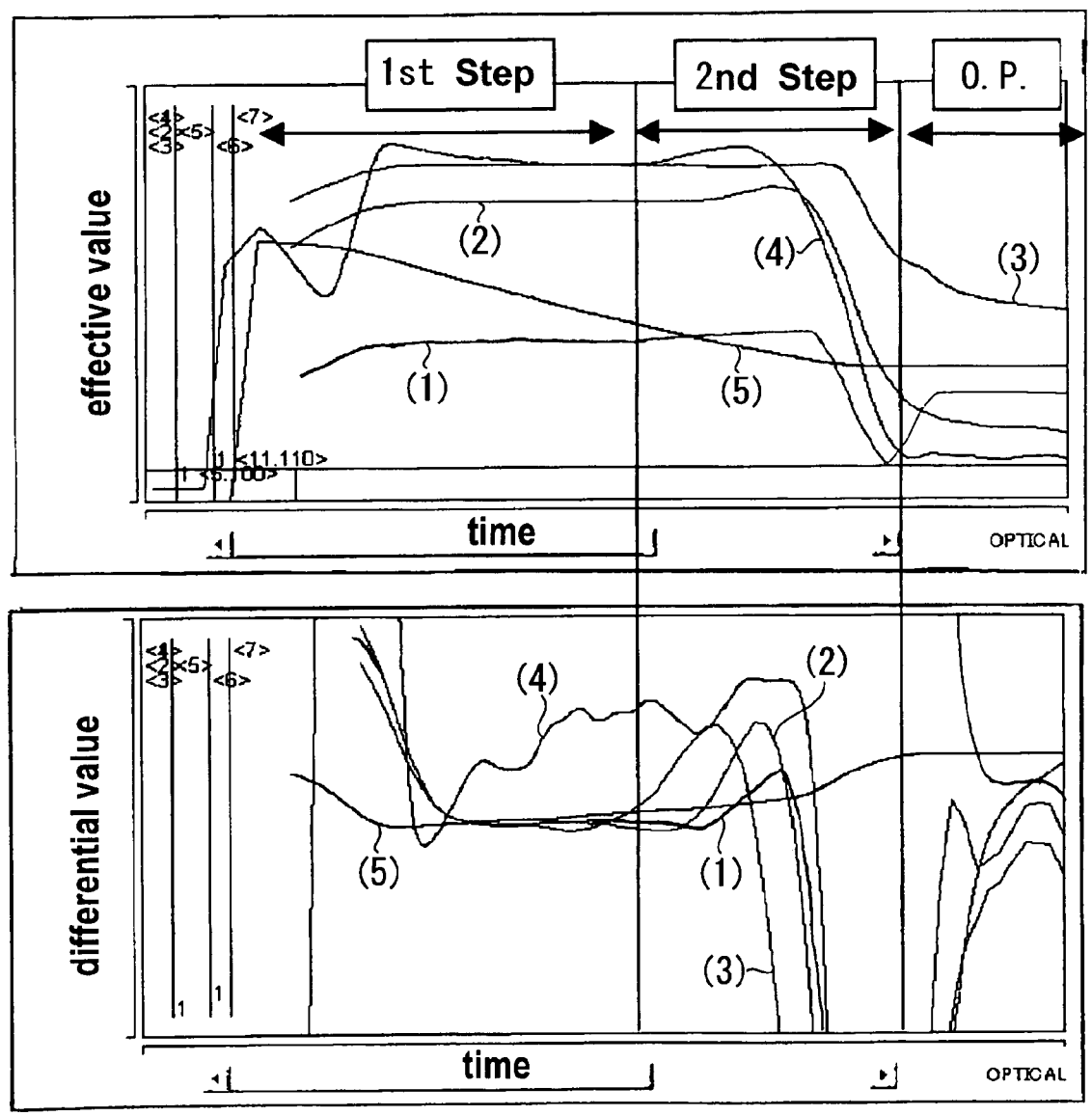
FIG. 7 is a graph showing the results of monitoring of the first step (1st step), the second step (2nd step) and the over-polishing (O.P.) stage of a polishing process, as monitored by measuring with an optical sensor a change in the reflectance of each of reflected lights having wavelengths of (1) 400 nm, (2) 600 nm and (3) 800 nm, and also monitored by means of (4) a torque sensor and (5) an eddy-current sensor.

FIG. 7 shows the results of monitoring of the first step (1st step), the second step (2nd step) and the over-polishing (O.P.) stage of the above-described polishing process, as monitored by measuring with an optical sensor a change in the reflectance of each of reflected lights having wavelengths of (1) 400 nm, (2) 600 nm and (3) 800 nm, and also monitored by means of (4) a torque sensor and (5) an eddy-current sensor.

As can be seen from FIG. 7, an optical sensor can measure a thickness of a conductive film after the thickness has become, e.g., not more than 100 nm. Thus, it is not possible to detect a change in the thickness of the conductive film during most of polishing. The concomitant use of an eddy-current sensor enables detection of a change in the relative thickness of the conductive film, though detection of the absolute thickness is difficult unless the initial film thickness is not measured. For example, the polishing rate can be calculated from a signal of the eddy-current sensor. Further, the concomitant use of a torque sensor can deal with false detection of the optical sensor.

Though, in this embodiment, the polishing surface is made of a polishing pad, it is also possible to use, e.g., a fixed abrasive for a polishing surface. The fixed abrasive may be a porous plate-like structure comprising abrasive grains fixed in a binder. In polishing using a fixed abrasive, polishing proceeds by abrasive grains which keep self-generating from the fixed abrasive during polishing. The fixed abrasive comprises abrasive gains, a binder and pores. For example, cerium oxide ($CeO_2$) grains having an average diameter of not more than 0.5 μm may be used as abrasive grains, and an epoxy resin may be used as a binder. Such a fixed abrasive provides a hard polishing surface. Usable fixed abrasives include, in addition to the above-described plate-like one, a fixed-abrasive pad having a two-layer structure of a thin fixed-abrasive layer and an elastic polishing pad. The above-described IC-1000 is another example which provides a hard polishing surface.

While the present invention has been described with reference to the embodiments thereof, it will be understood by those skilled in the art that the present invention is not limited to the particular embodiments described above, but it is intended to cover modifications within the inventive concept.

What is claimed is:

1. An apparatus for polishing a workpiece having a surface of a conductive film, said apparatus comprising:
   a polishing table having a polishing surface;
   a top ring configured to hold the workpiece, and being configured to press the workpiece against the polishing surface to polish the conductive film;
   an optical sensor configured to monitor the polishing state of the conductive film by emitting multi-wavelength light toward the conductive film of the workpiece held by the top ring, receiving reflected light from the conductive film and dispersing the reflected light into a spectrum to select a plurality of reflected lights, each reflected light of the plurality of reflected lights having a different specified wavelength from each other reflected light of the plurality of reflected lights, and measuring a change in the reflectance of said each reflected light of the plurality of reflected lights having a different specified wavelength to detect a thickness of the conductive film; and
   a control section configured to control a pressure at which the workpiece is pressed on the polishing surface.

2. The apparatus according to claim 1, wherein the optical sensor sends a signal to the control section when the optical sensor detects that a thickness of the conductive film has reached a predetermined value, and the control section switches polishing conditions from first polishing conditions to second polishing conditions based on the signal sent from the optical sensor.

3. The apparatus according to claim 2, wherein the pressure, at which the workpiece is pressed on the polishing surface, is smaller in the second polishing conditions than in the first polishing conditions.

4. The apparatus according to claim 2, wherein the optical sensor measures a change in the reflectance under the second polishing conditions using a wavelength different from that used for measuring a change in the reflectance under the first polishing conditions.

5. The apparatus according to claim 1, wherein the conductive film is a tungsten film, and the optical sensor is configured to detect a change in the reflectance of each reflected light having a wavelength of 400 nm, 600 nm or 800 nm.

6. The apparatus according to claim 5, wherein the optical sensor sends a signal to the control section when the optical sensor detects that the thickness of the tungsten film has reached 80 nm.

7. The apparatus according to claim 1, wherein the conductive film is a copper film, and the optical sensor is configured to detect a change in the reflectance of each reflected light having a wavelength of 400 nm, 600 nm or 800 nm.

8. The apparatus according to claim 7, wherein the optical sensor sends a signal to the control section when the optical sensor detects that a thickness of the copper film has reached not more than 100 nm.

9. A method for polishing a workpiece, said method comprising:
   polishing a surface of a conducting film of the workpiece by pressing the conductive film against a polishing surface at a predetermine pressure;
   monitoring the polishing state of the conductive film with an optical sensor by emitting multi-wavelength light toward the conductive film, receiving reflected light from the conductive film and dispersing the reflected light into a spectrum to select a plurality of reflected lights, each reflected light of the plurality of reflected lights having a different specified wavelength from each other reflected light of the plurality of reflected lights, and measuring a change in the reflectance of said each reflected light of the plurality of reflected lights having a different specified wavelength to detect a thickness of the conductive film; and
   switching polishing conditions from first polishing conditions to second polishing conditions when the optical sensor detects that a thickness of the conductive film has reached a predetermined value.

10. The method according to claim 9, wherein the pressure, at which the conductive film of the workpiece is pressed against the polishing surface, is smaller in the second polishing conditions than in the first polishing conditions.

11. The method according to claim 9, wherein the optical sensor measures a change in the reflectance under the second polishing conditions using a wavelength different from that used for measuring a change in the reflectance under the first polishing conditions.

* * * * *